US00RE41266E

(19) United States
(12) Reissued Patent
Degner et al.

(10) Patent Number: US RE41,266 E
(45) Date of Reissued Patent: Apr. 27, 2010

(54) COMPOSITE ELECTRODE FOR PLASMA PROCESSES

(75) Inventors: Raymond L. Degner, Los Altos, CA (US); Eric H. Lenz, Pleasanton, CA (US)

(73) Assignee: Lam Research Corporation, Fremont, CA (US)

(21) Appl. No.: 10/734,073

(22) Filed: Dec. 12, 2003

Related U.S. Patent Documents

Reissue of:

(64) Patent No.: 5,074,456
Issued: Dec. 24, 1991
Appl. No.: 07/584,324
Filed: Sep. 18, 1990

(51) Int. Cl.
*H01J 37/32* (2006.01)

(52) U.S. Cl. ..... 228/121; 228/122.1; 228/177; 156/345.34; 156/345.47; 156/914; 204/298.01; 29/592.1; 361/229; 445/51

(58) Field of Classification Search ..... 228/121, 228/122.1, 177; 156/345.34, 345.47, 914; 204/298.01; 29/592.1; 361/229; 445/51
See application file for complete search history.

(56) References Cited

U.S. PATENT DOCUMENTS 4,158,589 A 6/1979 Keller et al.

(Continued)

FOREIGN PATENT DOCUMENTS

| | | | | |
|---|---|---|---|---|
| EP | 0188208 | A2 | 7/1985 | |
| EP | 0346055 | A2 | 12/1989 | |
| EP | 0 346 055 | A2 | 12/1989 | |
| JP | 61-104625 | | 5/1986 | |
| JP | 61-120758 | U1 | 7/1986 | |
| JP | 61-243170 | A1 | 10/1986 | |
| JP | 61-243170 | | 10/1986 | |
| JP | 61-279672 | A1 | 12/1986 | |
| JP | 61-291967 | | 12/1986 | |
| JP | 61-291967 | A1 | 12/1986 | |
| JP | 62-109317 | | 5/1987 | |
| JP | 19731 | * | 1/1988 | ..... 445/51 |
| JP | 63-019731 | | 1/1988 | |
| JP | 63-317667 | | 12/1988 | |
| JP | 64-075673 | A1 | 3/1989 | |
| JP | H01-204424 | | 8/1989 | |
| JP | 01-204424 | A1 | 8/1989 | |
| JP | H02-194627 | | 8/1990 | |
| JP | 06-191033 | | 7/1994 | |
| WO | 8902695 | A | 3/1989 | |

OTHER PUBLICATIONS

*McGraw–Hill Dictionary of Scientific and Technical Terms*, p. 694, 2003.

*The Penguin Dictionary of Electronics*, p. 167, 1998.

McGuire, Semiconductor Material and Process Technology Handbook, for Very Large Scale Integration (VLSI) and Ultra Large Scale Integration (ULSI), Copyright 1988, Noyes Publications, Chapter 5, Particularly pp. 272–279, Fig. 51aiii.

*Primary Examiner*—Kevin P Kerns
(74) *Attorney, Agent, or Firm*—Buchanan Ingersoll & Rooney PC

(57) ABSTRACT

An electrode assembly for a plasma reactor, such as a plasma etch or plasma-enhanced chemical vapor deposition reactor, comprises an electrode plate having a support frame attached to one surface thereof. The electrode plate is composed of a substantially pure material which is compatible with a particular reaction being performed in the reactor, while the support frame is composed of a material having desirable thermal, electrical, and structural characteristics. The support frame is bonded to the electrode plate using a bonding layer, usually a ductile metallic bonding layer, which provides effective thermal and electrical coupling while permitting a degree of thermal expansion mismatch between the support frame and the electrode plate.

36 Claims, 3 Drawing Sheets

U.S. PATENT DOCUMENTS

| | | | | |
|---|---|---|---|---|
| 4,209,357 | A | 6/1980 | Gorin et al. | |
| 4,297,162 | A | 10/1981 | Mundt et al. | 156/643 |
| 4,340,462 | A | 7/1982 | Koch | 204/298 |
| 4,367,114 | A | 1/1983 | Steinberg et al. | 156/643 |
| 4,385,979 | A | 5/1983 | Pierce et al. | |
| 4,407,708 | A | 10/1983 | Landau et al. | |
| 4,443,951 | A | 4/1984 | Elsasser et al. | |
| 4,483,654 | A | 11/1984 | Koch et al. | |
| 4,534,816 | A | 8/1985 | Chen et al. | |
| 4,544,091 | A | 10/1985 | Hidler et al. | 228/124 |
| 4,564,435 | A | 1/1986 | Wickersham | 204/298 |
| 4,590,042 | A | 5/1986 | Drage | |
| 4,595,484 | A | 6/1986 | Giammarco et al. | |
| 4,600,563 | A | 7/1986 | Diederich | |
| 4,603,466 | A | 8/1986 | Morley | |
| 4,612,077 | A | 9/1986 | Tracy et al. | |
| 4,612,432 | A | 9/1986 | Sharp-Geisler | |
| 4,615,755 | A | 10/1986 | Tracy et al. | |
| 4,728,252 | A | 3/1988 | Lada et al. | |
| 4,780,169 | A | 10/1988 | Stark et al. | |
| 4,792,378 | A | 12/1988 | Rose et al. | 156/643 |
| 4,793,975 | A | 12/1988 | Drage | |
| 4,820,371 | A | 4/1989 | Rose | 156/345 |
| 4,833,790 | A | 5/1989 | Spencer et al. | |
| 4,871,421 | A | 10/1989 | Ogle et al. | |
| 4,904,621 | A | 2/1990 | Loewenstein | 437/225 |
| 4,931,135 | A | 6/1990 | Horiuchi et al. | 156/643 |
| 4,960,488 | A | 10/1990 | Law et al. | |
| 4,963,713 | A | 10/1990 | Horiuchi et al. | 219/121.45 |
| 5,006,220 | A | 4/1991 | Hijikata et al. | |
| 5,014,604 | A | 5/1991 | Hirao et al. | |

* cited by examiner

COMPOSITE ELECTRODE FOR PLASMA PROCESSES

Matter enclosed in heavy brackets [ ] appears in the original patent but forms no part of this reissue specification; matter printed in italics indicates the additions made by reissue.

1. Field of the Invention

The present invention relates generally to the design of electrodes used for producing a plasma in a reactor vessel. More particularly, the present invention relates to the design of a composite electrode useful in plasma reactors, such as plasmid etch and plasma-enhanced chemical vapor deposition reactors.

2. Description of the Background Art

Plasma etching of semiconductor wafers and other substrates relies on the production of ionized gaseous species using a radio frequency (rf) discharge at pressures in the range from about 0.1 to 10 Torr, commonly referred to as a glow discharge. The charged species react with molecules at the surface of the substrate, resulting in volatile reaction products which are carried away.

Several types of etchers are commonly employed in semiconductor fabrication including wet chemical (barrel) reactors, vertical dry chemical plasma reactors, and horizontal dry chemical plasma reactors. Of interest herein are dry chemical parallel plate plasma reactors. Such parallel plate reactors are typically characterized by a reactor volume defined by a pair of vertically spaced-apart horizontal electrode plates, although other orientations may also be employed. An enchant gas is typically fed through at least one of the electrode plates, and rf energy is applied across the electrodes to induce the desired plasma. Parallel plate reactors may be configured to process either single or multiple wafers. Single wafer parallel plate reactors, because of their highly symmetric electrical field and gas flow characteristics, are able to provide highly uniform etching across the surface of the wafer. Parallel plate reactors are described in a number of U.S. Pat. Nos. including 4,612,077; 4,534,816, 4,595,484, 4,590,042; 4,407,708; and 4,158,589, the disclosures of which are incorporated herein by reference.

Parallel plate plasma reactors usually operable by introducing a low pressure enchant gas through the upper electrode plate and placing a single wafer or multiple wafers over the lower electrode. The plasma is uniformly generated as the etchant gas flows downward and the rf energy is applied to the reactor, typically across the two electrodes.

The upper electrode must meet a number of requirements in order to achieve desired performance characteristics. Foremost, the electrode must have defined electrical properties, such as impedance, current capacity, and the like, in order to couple rf energy into the plasma in combination with the lower electrode. Additionally, the upper electrode material must be able to withstand prolonged exposure to the generated plasma, and interaction between the electrode material and the plasma should not have a deleterious effect on any of the desired plasma properties. In particular, the upper electrode should not generate large particles or large quantities of particles and should not release heavy metals or other contaminants into the zone between the opposed electrodes. Transition group metals severely degrade minority carrier lifetimes and significantly increase junction leakage. Alakalis, particularly sodium, cause instability in MOS threshold voltages. The temperature characteristics of the plasma are also critical to system performance, and it is desirable that the electrode be able to be maintained at a uniform, stable temperature across its entire surface. Finally, it is often desirable that the enchant gas be introduced through the upper electrode. In that case, the electrode material should be machinable in order to form the necessary passages and other features for delivering a uniform flow of gas therethrough.

Heretofore, upper electrodes for parallel plate plasma reactors have generally been formed from a single (or coated) material, such as polycrystalline silicon, graphite, aluminum, flame sprayed silicon powder on aluminum, or the like. While each of these materials enjoys certain advantages, e.g. polycrystalline silicon is compatible with many plasma chemistries, anodized aluminum is relatively inexpensive and easy to fabricate, and graphite is readily machined and can be purified to semiconductor purity, no one material has been found to meet all electrode requirements.

Thus, it would be desirable to provide improved upper electrode construction used in, inter alia, parallel plate plasma reactors. Such electrodes should possess desirable electrical and thermal properties, and should be compatible with any or all plasma chemistries. In particular, it would be desirable if such electrodes were relatively easy and inexpensive to fabricate.

SUMMARY OF THE INVENTION

According to the present invention, an electrode assembly suitable for use in a parallel plate plasma reactor comprises a plate, usually in the form of a disk, composed of a "semiconductor purity" material having a substantially uniform thickness. One face of the plate is bonded to a support frame composed of an electrically and thermally conductive material, leaving the other face substantially flat and free from protuberances. Usually, the support frame will be in the form of a ring which is bonded about the periphery of a plate in the form of a disk. Preferably, a plate and support frame are bonded together with a relatively ductile bonding layer formed by brazing, soldering, or the like. The bonding material should be composed of a thermally and electrically conductive material, such as metals, conductive epoxies, or the like preferably being formed from low vapor pressure materials which will leave less tendency to contaminate low pressure reactor environments.

The present invention comprises the electrode assemblies themselves as well as improved parallel plate electrode reactors which incorporate the electrode assemblies as an upper or exposed electrode thereof.

The composite electrodes of the present invention have a number of advantages over previous electrodes formed from a single material. The plate portion of the composite electrode which is exposed to plasma can be formed from material which is most suitable for the processing conditions with less concern for the cost of the material or the ability to machine the material. Thus, the material of choice can be dictated primarily by plasma chemistry and the desirability to minimize formation of particles and release of other contaminates. Similarly, the support frame can be composed of material which has desired electrical, thermal, and structural properties and which can be relatively easily machined or otherwise formed into a desired geometry, e.g. a ring. In particular, the material of the support frame should not be brittle and should allow treatment within the reactor by bolting or other conventional fasteners. The material of the support frame will usually be chosen to have a thermal expansion coefficient which is generally compatible with that of the electrode plate, but a certain amount of mismatch can be tolerated when the bonding layer is formed from a ductile material. In a preferred embodiment, the support frame is chosen to have a slightly greater coefficient of thermal expansion. By then joining and/or curing the bonding layer at a temperature above the expected operating temperature of the electrode, the electrode plate will be maintained under compression, enhancing the durability of the plate. In this way, the support frame can be reliably connected to an electrical power source as well as a heat sink intended to control the temperature of the electrode. By properly configuring the contact area between the support frame and the electrode plate, the rf fields produced by the electrode as well as the temperature profile maintained across the electrode can be maintained within desired parameters.

DESCRIPTION OF THE SPECIFIC EMBODIMENTS

Figure 4:
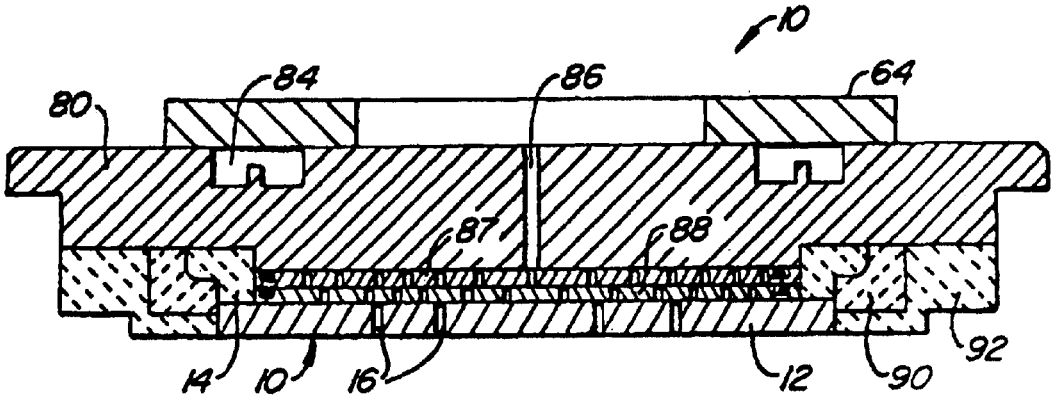
FIG. 4 is a detailed view of the mounting of the electrode assembly of the present invention within the reactor system of FIG. 3.

The present invention provides an improved construction for an electrode assembly useful particularly in parallel plate plasma reactor apparatus. Such reactor apparatus typically include upper and lower electrodes where the upper electrode is mounted in a housing which is capable of moving up and down relative to the lower electrode. The lower electrode which is generally fixed, will serve as a support service or "chuck" for the semiconductor wafer or other article which is being treated. A particular construction for such a reactor is described in more detail hereinafter with reference to FIG. 3.

The electrode assembly of the present invention comprises a generally flat plate, usually in the form of a disk having a substantially uniform thickness thereacross, which is composed of a material which is "semiconductor pure". Semiconductor purity means that the material is at least 99.999% pure and is substantially free of trace contaminants that could interfere with the associated wafer fabrication process. In particular, the material should have a total ash content of less than 10 parts per million (ppm) including minimal amounts of heavy metal, transition group metal, and alkali contaminants which are particularly damaging to silicon device performance.

The plate will provide an electrode surface which is exposed to the plasma in the parallel plate or other reactor. Thus, the plate will be composed of a particular semiconductor pure material which is selected to be compatible with the plasma chemistry being performed in the reactor. Etching is typically performed with halogen-based chemistries, and the materials listed in Table 1 below are generally suitable for most such chemistries. This listing is not meant to be comprehensive and other electrode materials and plasma chemistries may also be used in the present invention.

TABLE 1

| |
|---|
| Graphite |
| Polycrystalline silicon |
| Quartz |
| Glassy carbon |
| Single crystal silicon |
| Pyrolytic graphite |
| Silicon carbide |
| Alumina |
| Zirconium |
| Diamond-coated materials |
| Titanium oxide |

The thickness and other dimensions of the electrode plate are not critical and will be selected based on the dimensions of the reactor, cost of the material, machinability of the material, material erosion rate, and the like. Usually, however, for expensive material it will be desirable to minimize the thickness of the electrode plate while providing sufficient material to permit extended use before thinning of the material requires replacement. Most commonly, the plate will be in the form of a disc having a diameter in the range from about 12 cm to 32 cm, usually being in the range from about 15 cm to 25 cm. The thickness of the plate will be in the range from about 0.1 cm to 2 cm, usually being in the range from about 0.3 cm to 1 cm.

The geometry of the electrode plate will generally be symmetric and relatively simple in order to enhance uniform electrical and thermal characteristics as well as minimize stresses which might occur during machining, mounting, and/or use of the electrode. The most preferred geometry is a round disk. The plate will generally be flat and free from protuberances, but the upper face might have ridges, shoulders, or other symmetric features. In particular, a peripheral shoulder may be provided to facilitate connection to a support ring, as described below. The exposed face of the electrode plate will be free from protuberances and it will usually be desirable to form apertures or orifices through the plate in order to facilitate introduction of reactant gases into the reactor volume. Such apertures will generally be chosen to have symmetrical characteristics, usually having a circular profile, and will be typically laid out in a uniform, symmetric pattern which will minimize non-uniformities in the thermal, electrical, and structural properties of the disk.

As an alternative to discrete orifices, electrode plates may be formed from a porous, sintered material, as described in U.S. Pat. No. 4,367,114, the disclosure of which is incorporated herein by reference. In some cases, it will also be possible to form the electrode with a slight curvature, as described in U.S. Pat. Nos. 4,603,466 and 4,615,755, the disclosures of which are incorporated herein by reference. The use of such "domed" electrodes, however, is generally limited to the electrode which supports the wafer being processed.

The electrode assembly of the present invention further comprises a support frame which is bonded to one face or surface of the electrode plate. The support frame provides mechanical support for the electrode plate when mounted in the reactor housing, as discussed hereinafter. Additionally, the support frame will provide electrical and thermal connection of the electrode plate to the rf source and heat sink provided within the reactor. Thus, the support frame is preferably formed from a material having high electrical and thermal conductivities. By electrical conductivity, of course, it is meant the materials should have a low impedance within the rf range of interest, typically either about 400 kHz or about 13 MHz. The material of the support frame should be readily machinable so that the support frame can be shaped to be compatible with mounting of the electrode assembly in a wide variety of parallel plate and other reactor systems. Suitable materials for this support frame include graphite, aluminum, copper, stainless steel, and the like.

The support frame may assume virtually any geometry, but will preferably have a symmetric geometry corresponding to that of the electrode plate, i.e., usually having a circular symmetry in order to enhance uniform thermal, electrical, and structural characteristics in the electrode assembly during use. In the case of circular electrode plates, i.e. disks, the support frame will typically be an annular ring (or include a plurality of concentric annular rings) which is bonded about the periphery of one face of surface of the electrode plate. As described in more detail hereinafter with reference to the drawings, the use of the annular ring defines a region for receiving enchant gases which are then passed through the apertures or orifices, when present in the electrode plate. Alternatively, the support frame could itself be a disk having apertures aligned with the apertures in the electrode plate (if any) to allow introduction of reactant gases.

Figure 1:
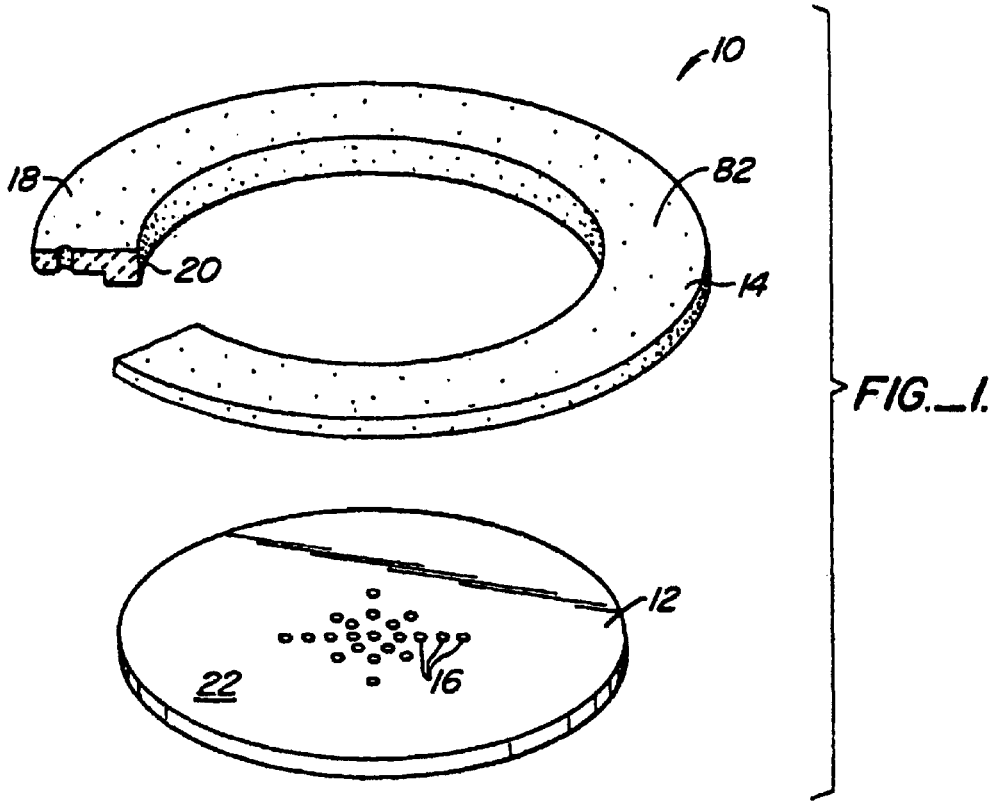
FIG. 1 is an exploded view of an electrode assembly constructed in accordance with the principles of the present invention, shown with a portion of the support ring broken away.
Figure 2A:
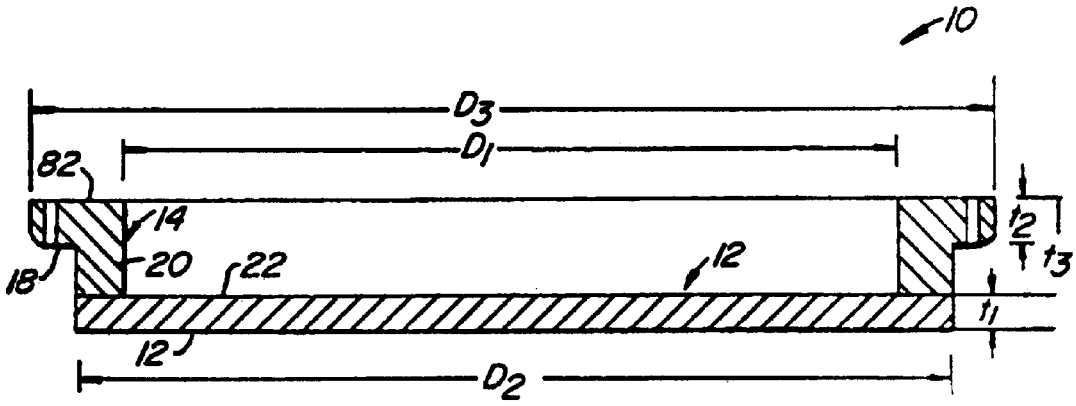
FIG. 2A is a cross-sectional view of the electrode assembly of FIG. 1.

Referring now to FIGS. 1 and 2A, an electrode assembly 10 constructed in accordance with the principles of the present invention includes plate 12 in the form of a disk and a support frame 14 in the form of an annular ring. The electrode plate 12 will generally be formed from the materials and have the dimensions set forth above The plate includes apertures 16 formed near its center in order to distribute a reactant gas therethrough, as described in more detail hereinafter. The apertures 16 may extend over a greater portion of the plate than illustrated, but will usually be maintained in a symmetric arrangement for the reasons discussed above.

Support ring 14 includes a flange portion 18 and a downward extension portion 20. The downward extension is sized to engage the upper surface 22 of electrode disk 12 about its periphery.

Exemplary dimensions for the electrode assembly 10 are set forth herein below.

TABLE 2

| Dimension | Range |
|---|---|
| $D_1$ | 10-30 cm |
| $D_2$ | 12-32 cm |
| $D_3$ | 15-35 cm |
| $t_1$ | 0.1-2 cm |
| $t_2$ | 0.2-2 cm |
| $t_3$ | 0.3-5 cm |

The support ring 14 may be bonded to the electrode plate 12 by any suitable process which provides the necessary bonding strength as well as thermal and electrical characteristics. Typically, bonding will be performed by either brazing, soldering or use of adhesives to form a ductile bonding layer, preferably having a low vapor pressure. The ductility is desirable so that any thermal expansion mismatch between the electrode plate 12 and support ring 14 will not result in breaking or fracturing of the bond, or the electrode plate 12.

With both soldering and brazing, a metallic bonding layer will be formed between the electrode plate and the support frame. Suitable metals include ductile, low vapor pressure metals, such as indium, silver, and alloys thereof. Particularly preferred is the use of indium. The characteristics of indium are particularly well balanced for use as the bonding layer. Indium is available at relatively high purity, has a high ductility, and provides good wetting of and abrasion to other materials. Additionally, indium has moderate strength, a moderate melting point, and a relatively low vapor pressure which minimizes loss into the reactor. The difference between soldering and brazing is primarily temperature, with soldering generally being performed at below about 800° F. and brazing generally being performed at above about 800° F.

In a preferred embodiment, the electrode plate 12 is secured to the support ring 14 by soldering with indium at a temperature of about 310° F. to 320° F. Soldering is a less expensive process and is particularly suitable for joining materials which have a large mismatch in their coefficients of thermal expansion. The relatively low solidification temperature of soldered materials minimizes the expansion mismatch at the solidification temperature. Brazing will usually provide a higher strength bond, but is suitable only for materials which have well matched thermal expansion coefficients in order to avoid high stresses in the bonding layer and electrode plate after cooling to room temperature.

As an alternative to soldering or brazing, the bonding layer may be formed from an electrically and thermally conductive adhesive, preferably from a metal filled epoxy such as a silver, aluminum, nickel, platinum, gold, iron, and copper-filled epoxy. Suitable metal filled epoxies are commercially available from suppliers, such as Devcon Corporation, Thermoset Plastics, Shell Company, and Varian Associates.

The support ring 14 and electrode pair 12 will be bonded at an interface region defined by the contact area between the ring and the plate. It will generally be advantageous to maximize the interface area in order to enhance thermal and electrical contact as well as structural support. Usually, the contact area will have an annular width of at least about 1 cm, preferably being at least about 1.5 cm. The width may, of course, be greater up to and including having contact along the entire rear surface of the plate.

When employing brazing or soldering, it will usually be desirable to coat thin layers of metal on the interface region of both the support frame and the electrode to enhance wetability and adhesion of the bonding layer. Suitable metals typically include titanium and nickel, and will usually be applied to thicknesses in the range from about 1000 Å to 50,000 Å by conventional techniques, such as sputtering.

In forming the electrode assembly 10, it will be desirable to "pre-stress" the support ring 14 so that it provides a radially-directed inward compression on the electrode plate 12. Such a compressive stress helps to inhibit stress fracturing of the electrode plate 12 during use. More specifically, by utilizing a support ring 14 which is formed from a material which has a slightly larger thermal expansion coefficient than that of the electrode plate, and forming or curing the bonding layer at a temperature above the expected operating temperature, the support ring will apply a constant compressive force on both the electrode plate and the bonding layer. Even when the temperature of the electrode assembly is raised from room temperature to the operation temperature, the support ring will still be in compression (although reduced relative to room temperature). Thus, thermal cycling will be less likely to fracture the electrode plate which is fragile relative to the support ring.

Figure 3:
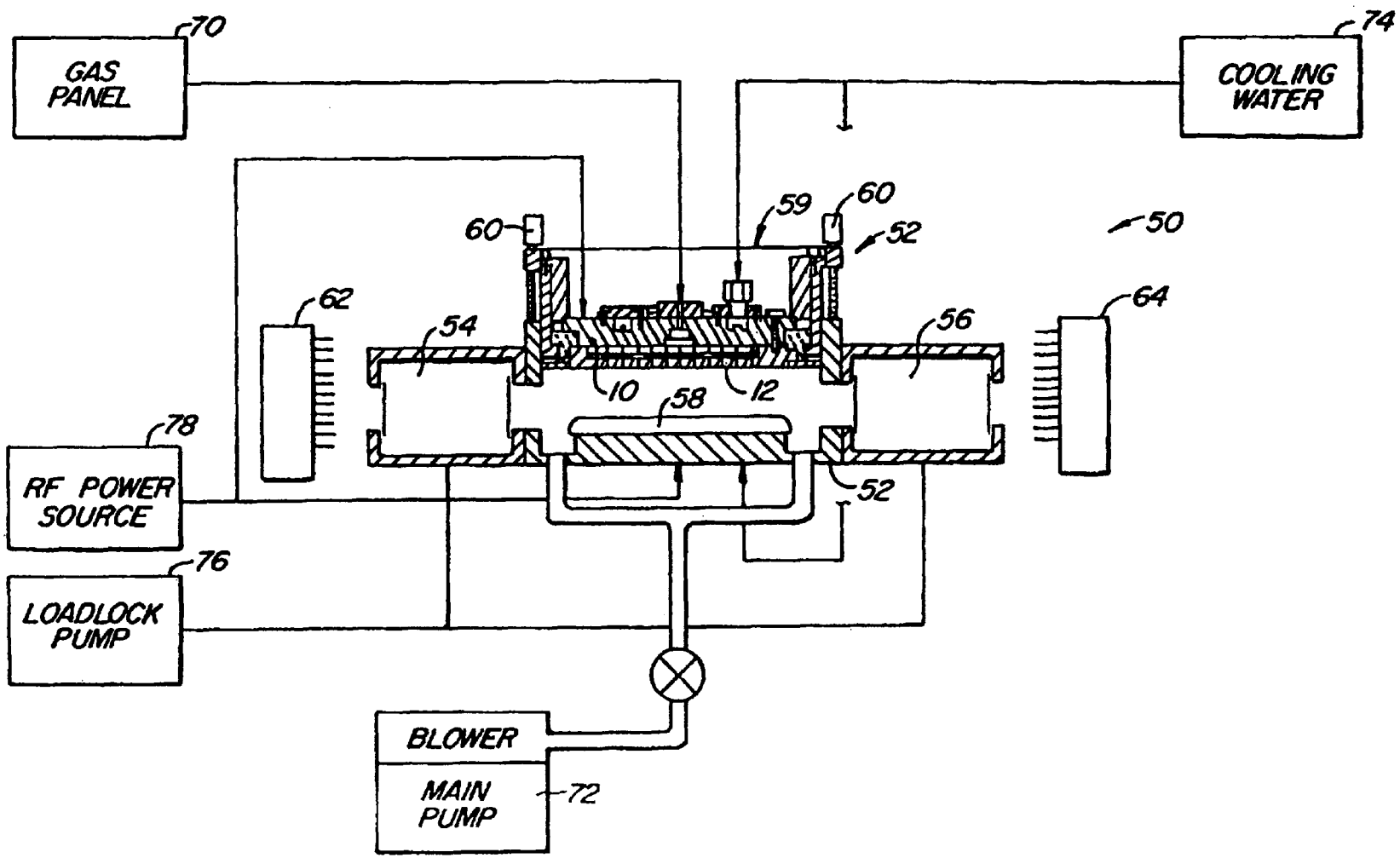
FIG. 3 is a schematic illustration of a plasma reactor system employing the electrode assembly of the present invention.

Referring now to FIGS. 3 and 4, an improved parallel plate reactor system 50 employing the electrode assembly 10 of the present invention will be described. The reactor system 50 includes chamber 52, an inlet load lock 54, and an outlet load lock 56. Construction of a suitable reactor housing 52 is described in detail in U.S. Pat. No. 4,340,462, the disclosure of which is incorporated herein by reference.

Briefly, the reactor housing 52 includes a lower electrode plate 58 which is adapted to receive a single wafer substrate on its upper surface. The electrode assembly 10 is mounted in an upper structure 59 which is reciprocally mounted in an open upper end of the reactor chamber 52 with a motor-driven screw mechanism 60 capable of raising and lowering the upper structure 59. In this way, the gap between the exposed surface of electrode plate 12 and the lower electrode 58 may be precisely adjusted.

The load lock mechanisms 54 and 56 include means for transferring single wafers from a wafer supply source 62 through the reactor vessel 52 and out to a wafer receptacle 64. The construction of suitable load locks and transfer mechanisms are described in detail in U.S. Pat. Nos. 4,433,951; 4,483,654; 4,728,252; and 4,833,790, the disclosures of which are incorporated herein by reference. The reactor system 50 will also include an etchant gas source 70 connected to the electrode housing 59 to deliver the etchant gas to the electrode assembly 10. The system further includes a blower and main pump 72 used to maintain the pressure in the housing 52 at the desired level, typically in the range from about 0.01 to 10 Torr. The reactor system 50 will also include a cooling water source 74 connected above the upper and lower electrodes, as well as a load lock pump 76 for drawing down the pressure in load locks 54 and 56. Finally, the system 50 includes an rf power source 78 for supplying the necessary excitation voltage to the electrode assembly 10 and lower electrode 58. An exemplary power source is described in detail in U.S. Pat. No. 4,871,421, the disclosure of which is incorporated herein by reference.

Figure 2B:
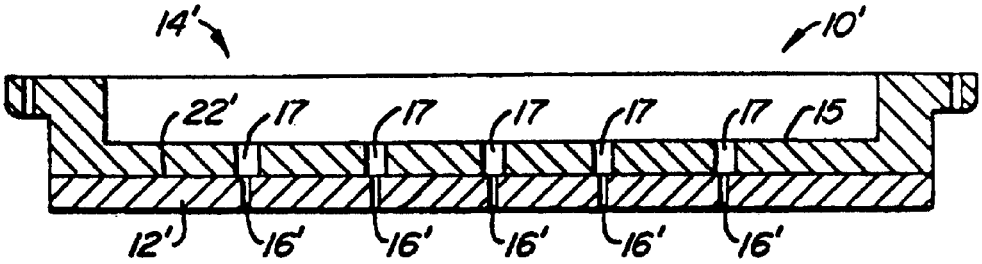
FIGS. 2B and 2C illustrate cross-sectional views of two alternate embodiments of the electrode assembly of the present invention.
Figure 2C:
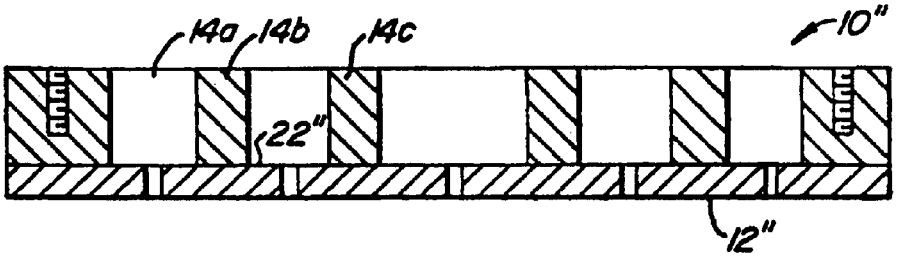

Alternate embodiments of the electrode assembly of the present invention are illustrated in FIGS. 2B and 2C. The electrode assembly 10' (FIG. 2B) is similar to electrode assembly 10 (FIG. 2A), except that the support frame 14' is not an open ring, but rather incorporates a disk which contacts the entire upper surface 22' of electrode plate 12'. The disk portion 15 of support frame 14' includes apertures 17 which are aligned with apertures 16' in the electrode plate 12' to allow passage of a reactant gas. The embodiment of FIG. 2B provides for enhanced structural support as well as thermal and electrical contact between the support frame and electrode plate.

The electrode assembly 10" (FIG. 2C) includes three concentric support rings 14a, 15b, and 14c bonded to the upper surface 22" of the electrode plate 12". The use of multiple support rings enhances structural support as well as thermal and electrical contact while leaving direct access to apertures 16" in the electrode plate.

Referring now in particular to FIG. 4, the electrode assembly 10 is mounted in the upper structure 59 of reactor housing 52 with the lower surface of electrode disk 12 being exposed over its entire area. That is, there is no mechanical structure holding the electrode disk 12 in place within upper structure 59. Instead, support ring 14 is secured to a backing plate 80, which is typically formed from a metal, such as aluminum. The support ring 14 is attached to the backing plate 18, typically using fasteners, (not illustrated), so that continuous contact is made between upper exposed surface 82 of the support ring 14 and a lower surface of the backing plate 80. A cooling channel 84 is formed in an upper surface of the backing plate 80, and the channel is covered by a ring plate 64. Thus, the channel 84 forms a cooling duct for receiving cooling water from source 74. Provisions (not shown) for electrically connecting the backing plate 80 to the rf power source 78 will also be provided. In this way, electrical and thermal contact between the backing plate 80 and the electrode plate 12 is maintained through the upper surface of support ring 14.

Reactant gas from gas panel 70 is fed to electrode plate 12 through central passage 86. The gas enters the region between the rear (unexposed) surface of electrode plate 12 and the lower surface of backing plate 80. A pair of baffle plates 87 and 88 are provided in the region between the backing plate 80 and electrode plate 12 in order to help distribute the gas evenly through apertures 16 formed in the electrode plate. The baffle plates may be substantially solid disks including a plurality of apertures (as illustrated) or may alternatively be screen members defining a plurality of tortuous paths in order to help distribute the reactive gas.

Additional structure including a first insulating ring 90 and a second insulating ring 92 are provided about the outer periphery of the electrode assembly 10. Such structure protects the support ring 14 from direct contact with the plasma, enhances the electrical field properties of the electrode plate 12 during use, and electrically insulates the electrode assembly 10 from the upper structure 59.

Although the foregoing invention has been described in some detail by way of illustration and example for purposes of clarity of understanding, it will be obvious that certain changes and modifications may be practiced within the scope of the intended claims.

What is claimed is:

1. An improved reactor of the type having a first electrode for supporting a substrate, an opposed electrode, and means for producing a plasma therebetween, wherein the opposed electrode has one face exposed to the first electrode and an opposite face connected to an electrical source and a thermal sink, the improvement comprising an opposed electrode including (a) an electrode plate composed of a substantially pure material and having a substantially uniform thickness and (b) a support frame composed of an electrically and thermally conductive material bonded to a back face of the plate, whereby the support frame is connected to the electrical source and thermal sink and a front face of the plate which is exposed to the first electrode is substantially free from protuberances.

2. An improved reactor as in claim 1, wherein the opposed electrode is mounted in an assembly having an insulating ring which is flush with the entire periphery of the exposed face, whereby the support frame is protected from exposure to the plasma.

3. An improved reactor as in claim 1, wherein the electrode plate comprises a disk.

4. An improved reactor as in claim 3, wherein the disk includes a plurality of apertures therethrough to permit the flow of a reactant gas into the space between the electrodes.

5. An improved reactor as in claim 3, wherein the support frame comprises a ring which is secured about the periphery of the disk.

6. An improved reactor as in claim 3, wherein the support frame comprises a plurality of concentric rings secured to the opposite face of the electrode disk.

7. An improved reactor as in claim 3, wherein the support frame comprises a flat plate which is secured to and covers substantially the entire opposite face of the electrode disk.

8. An improved parallel electrode reactor as in claim 5, wherein the disk as a diameter in the range from about 12 to 32 cm and a thickness in the range from about 0.1 to 2 cm.

9. An improved reactor as in claim 8, wherein the right has an annular width in the range from about 0.5 to 5 cm and a thickness in the range from about 0.2 to 3 cm.

10. An improved reactor as in claim 1, wherein the plate is bonded to the support frame by means of a bonding layer.

11. An improved reactor as in claim 10, wherein the bonding layer is composed of a material having a low vapor pressure.

12. An improved reactor as in claim 11, wherein the bonding layer material is selected from the group consisting of indium, silver, and metal-filled epoxies.

13. An improved reactor as in claim 12, wherein the bonding layer is formed by brazing, soldering, or adhesion.

14. An improved reactor as in claim 13, wherein at least one of the plate and the support frame is metallized in the region to be bonded prior to brazing, soldering, or adhesion.

15. An improved reactor as in claim 10, wherein the bonding layer is substantially free from voids and has substantially uniform electrical and thermal conductivities through the region of bonding.

16. An improved reactor as in claim 1, wherein the electrode plate is composed of a pure material selected from the group consisting of graphite, polycrystalline silicon, quartz, glassy carbon, single crystal silicon, pyrolytic graphite, silicon carbon, alumina, zirconium, diamond-coated materials, and titanium oxides.

17. An improved reactor as in claim 1, wherein the electrically and thermally conductive material is selected from the group consisting of graphite, aluminum, copper, and stainless steel.

18. An electrode assembly comprising:

an electrode *disk* composed of a substantially pure material and having a substantially uniform thickness; and a support ring bonded about the periphery of one face of the disk, leaving the other face substantially flat and free from protuberances, wherein the support ring is composed of an electrically and thermally conductive material.

19. An electrode assembly as in claim 18, wherein the disk includes a plurality of apertures to permit gas flow therethrough.

20. An electrode assembly as in claim 18, further comprising at least one additional support ring mounted concentrically within the peripheral support ring or the one face of the disk.

21. An electrode assembly as in claim 18, wherein the support ring includes an interior plate which contacts substantially the entire one face of the disk.

22. An electrode assembly as in claim 18, wherein the disk has a diameter in the range from about 12 to 32 cm and a thickness in the range from about 0.1 to 2 cm.

23. An electrode assembly as in claim 18, wherein the ring has an annular width in the range from about 0.5 to 5 cm and a thickness in the range from about 0.2 to 3 cm.

24. An electrode assembly as in claim 18, wherein the disk is bonded to the ring by means of a bonding layer.

25. An electrode assembly as in claim 14, wherein the bonding layer is composed of a ductile metal or alloy or a metal-filled epoxy having a low vapor pressure.

26. An electrode assembly as in claim 25, wherein the ductile metal or alloy is selected from the group consisting of indium, silver, and metal-filled epoxies.

27. An electrode assembly as in claim 26, wherein the bonding layer is formed by brazing, soldering, or adhesion.

28. An electrode assembly as in claim 27, wherein at least one of the disk and the ring is metallized in the region to be bonded prior to brazing, soldering, or adhesion.

29. An electrode assembly as in claim 24, wherein the bonding layer is substantially free from voids and has substantially uniform electrical and thermal conductivities through the region of bonding.

30. An electrode assembly as in claim 18, wherein the material is selected from the group consisting of graphite, polycrystalline silicon, quartz, glassy carbon, single crystal silicon, pyrolytic graphite, silicon carbide, alumina, zirconium, diamond-coated materials, and titanium oxides.

31. An electrode assembly as in claim 18, wherein the electrically and thermally conductive material is selected from the group consisting of graphite, aluminum, copper, and stainless steel.

32. An electrode assembly as in claim 18, wherein the support ring is pre-stressed to impart a radially inward compression on the electrode disk.

33. A method for forming an electrode assembly including a support ring and an electrode plate, said method comprising:

bonding the support ring about the periphery of the electrode plate at elevated temperature, wherein the material of the [electrode plate] *support ring* has a higher coefficient of thermal expansion than that of the electrode plate; and allowing the bonded assembly to return to room temperature, whereby the differential contraction imparts the desired stress.

34. A method as in claim 33, wherein the elevated temperature is chosen to be above an expected operating temperature of the electrode assembly.

35. A method as in claim 33, wherein the electrode plate is formed from a substantially pure material selected from the group consisting of graphite, polycrystalline silicone, quartz, glassy carbon, single crystal silicon, pyrolytic graphite, silicon carbon, alumina, zirconium, diamond-coated materials, and titanium oxides.

36. An electrode assembly formed by the method of claim 33.

* * * * *